(12) United States Patent
Robustelli (10) Patent No.: US 11,105,862 B2
(45) Date of Patent: Aug. 31, 2021

(54) METHODS AND SYSTEMS FOR ASSESSING MULTICELL BATTERY HEALTH

(71) Applicant: SYMBOL TECHNOLOGIES, LLC, Lincolnshire, IL (US)

(72) Inventor: Michael Robustelli, Smithtown, NY (US)

(73) Assignee: Symbol Technologies, LLC, Holtsville, NY (US)

( * ) Notice: Subject to any disclaimer, the term of this patent is extended or adjusted under 35 U.S.C. 154(b) by 623 days.

(21) Appl. No.: 15/836,407

(22) Filed: Dec. 8, 2017

(65) Prior Publication Data

US 2019/0178947 A1 Jun. 13, 2019

(51) Int. Cl.
| | |
|---|---|
| *G01R 31/396* | (2019.01) |
| *H02J 7/00* | (2006.01) |
| *H02J 7/04* | (2006.01) |
| *G01R 31/378* | (2019.01) |
| *G01R 31/392* | (2019.01) |
| *H01M 10/48* | (2006.01) |

(52) U.S. Cl.
CPC ......... *G01R 31/396* (2019.01); *G01R 31/378* (2019.01); *G01R 31/392* (2019.01); *H01M 10/48* (2013.01); *H02J 7/0021* (2013.01); *H02J 7/045* (2013.01); *H02J 2207/10* (2020.01)

(58) Field of Classification Search
CPC .................................................... G01R 31/396
USPC ........................................................ 320/134
See application file for complete search history.

(56) References Cited

U.S. PATENT DOCUMENTS

| | | | |
|---|---|---|---|
| 9,222,985 B2 * | 12/2015 | Kang | H01M 10/4207 |
| 9,838,530 B1 | 12/2017 | Robustelli et al. | |
| 10,170,920 B2 | 1/2019 | Robustelli et al. | |
| 10,230,252 B2 | 3/2019 | Noor et al. | |
| 10,554,056 B2 * | 2/2020 | Jeon | H02J 7/0026 |
| 2002/0070707 A1 * | 6/2002 | Sato | H01M 10/482 |
| | | | 320/134 |

* cited by examiner

*Primary Examiner* — Edward Tso
*Assistant Examiner* — Ahmed H Omar (57) ABSTRACT

A method of assessing multicell battery health in a battery control device includes: obtaining (i) a measured indicator value corresponding to an indicator battery parameter, and (ii) a measured first input value corresponding to a first input parameter; obtaining, based on the first input value, an expected indicator value corresponding to the indicator battery parameter; determining whether a difference between the measured indicator value and the expected indicator value exceeds a predefined cell loss threshold; and when the difference exceeds the predefined cell loss threshold, generating a cell loss alert.

20 Claims, 5 Drawing Sheets

METHODS AND SYSTEMS FOR ASSESSING MULTICELL BATTERY HEALTH

BACKGROUND

Rechargeable batteries are used in a wide variety of applications, for example to power mobile computing devices such as label printers, barcode scanners and the like. Such batteries often include a plurality of cells (e.g. two to three cells). One or more of the cells may become disconnected from the battery terminals, for example due to mechanical damage suffered by the battery or other defects. The disconnection of a cell, in addition to negatively affecting the performance of the battery, may present a reliability risk because the remaining connected cell(s) will be subject to a greater than specified charging current.

Many rechargeable batteries include onboard controllers configured to monitor battery health and state of charge. However, such controllers may not be equipped to diagnose disconnected cells.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Examples disclosed herein are directed to a method of assessing multicell battery health in a battery control device, comprising: obtaining (i) a measured indicator value corresponding to an indicator battery parameter, and (ii) a measured first input value corresponding to a first input parameter; obtaining, based on the first input value, an expected indicator value corresponding to the indicator battery parameter; determining whether a difference between the measured indicator value and the expected indicator value exceeds a predefined cell loss threshold; and when the difference exceeds the predefined cell loss threshold, generating a cell loss alert.

Further examples disclosed herein are directed to a battery control device for assessing multicell battery health, comprising: a collector configured to obtain (i) a measured indicator value corresponding to an indicator battery parameter, and (ii) a measured first input value corresponding to a first input parameter; an expected value generator configured to obtain, based on the first input value, an expected indicator value corresponding to the indicator battery parameter; an alert generator configured to: determine whether a difference between the measured indicator value and the expected indicator value exceeds a predefined cell loss threshold; and when the difference exceeds the predefined cell loss threshold, generate a cell loss alert.

Figure 1:
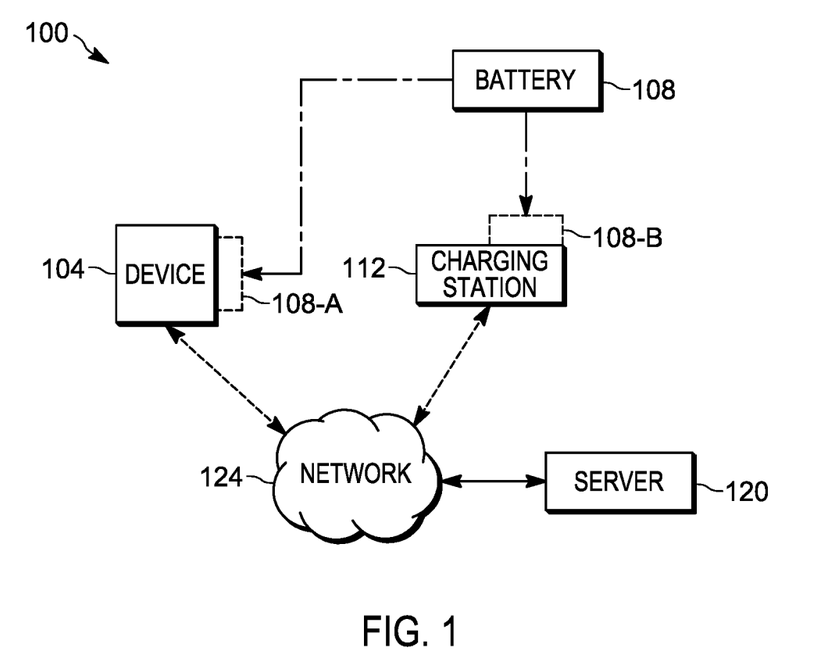
FIG. 1 is a schematic of a system for assessing multicell battery health.

FIG. 1 depicts an example system 100 constructed in accordance with the teachings of this disclosure. The system 100 includes a battery-powered device 104. The device 104 can be implemented as any of a variety of computing devices, including a mobile computing device such as a laptop computer, a tablet computer, a smart phone, a mobile scanner, a mobile printer, a mobile RFID and/or NFC reader, or the like. The device 104 can additionally perform any of a variety of functions and can include suitable components for performing such functions. Examples of the functions performed by the device 104 include encoding functions (e.g. label printing, writing data to RFID tags and the like), decoding functions (e.g. laser- or image-based barcode scanning, RFID tag reading), or combinations thereof. Other example functions will also now be apparent to those skilled in the art.

The device 104 is referred to as a battery-powered device because, for at least a portion of the operational activity of the device 104, the device 104 is supplied with electrical power from a rechargeable battery 108. Under certain conditions, the device 104 may be supplied with power from a source other than the battery 108. The battery 108 is illustrated in FIG. 1 as a removable battery. That is, the battery 108 may be removed from the device 104 without physically damaging the device 104 or the battery 108. The device 104 may therefore be powered by any of a plurality of batteries (not shown), and the battery 108, following removal from the device 104, may be placed in a charging station 112 (also referred to herein as a charger 112) for recharging and subsequent use in powering the device 104. FIG. 1 illustrates the deployment of the battery 108 to power the device in a position 108-A, and the connection of the battery 108 with the charger 112 in a position 108-B. In other examples, the battery 108 is integrated with the device 104. That is, the battery 108 may not be removed from the device 104 without physically damaging one or both of the battery 108 and the device 104.

The system 100, in the present example, also includes a server 120 connected to one or both of the device 104 and the charging station 112 via a network 124, such as a wireless or wired local area network. The device 104 and the charging station 112 may exchange data with each other and with the server 120 over the network 124, as will be discussed below in greater detail. In other examples, one or both of the server 120 and the network 124 may be omitted.

Figure 2A:
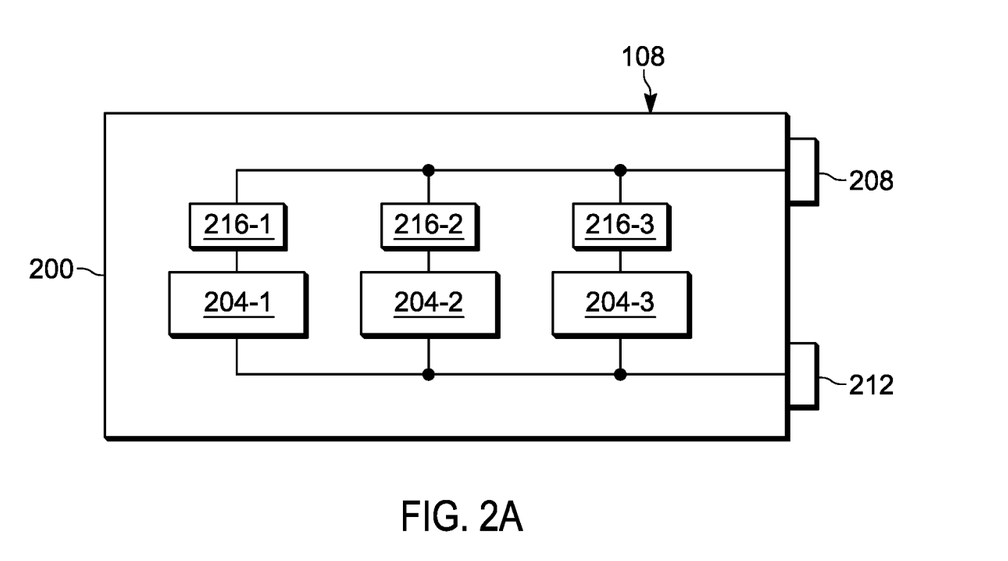
FIGS. 2A and 2B are diagrams of certain internal components of a battery of FIG. 1.

Turning to FIG. 2A, certain internal components of the battery 108 are illustrated. In particular, the battery 108 includes a housing 200 containing a plurality of cells 204. In the present example, three cells 204-1, 204-2 and 204-3 (collectively referred to as cells 204, and generically referred to as a cell 204) are illustrated. In other examples, the battery 108 includes more than three cells 204; in still other examples, the battery 108 includes two cells 204. The cells 204 are typically, although not necessarily, connected in parallel between a pair of terminals 208 and 212, which are connected to corresponding electrical contacts (not shown) in the device 104 or the charger 112 to, respectively, supply power to the device 104 or receive power from the charger 112. The battery 108 can also include, as shown in FIG. 2A, one or more fuses 216. In particular, fuses 216-1, 216-2 and 216-3 are connected in series with each cell 204. Each fuse 216 is configured to disconnect the corresponding cell 204 under certain conditions (e.g. when an over-current condition is detected).

Figure 2B:
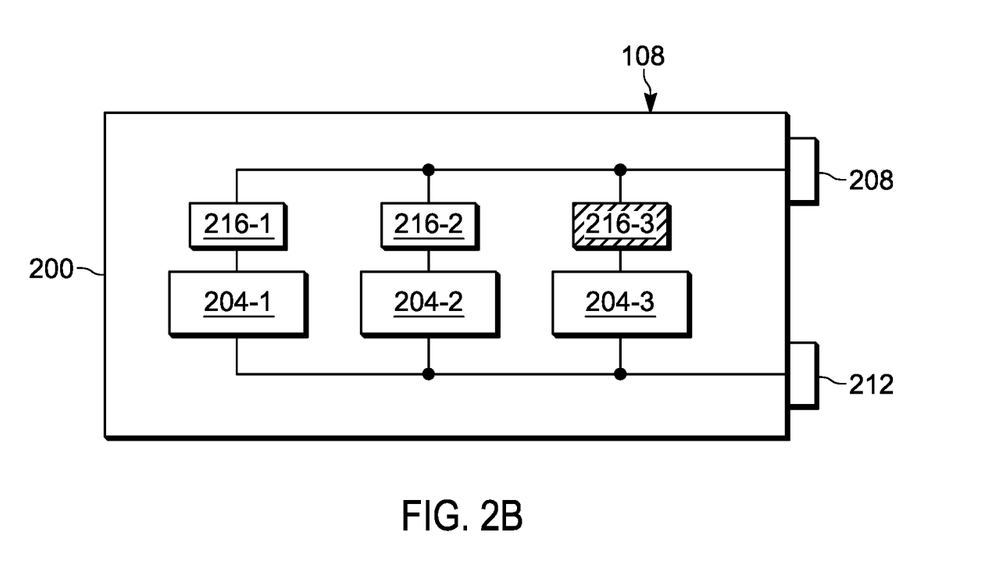

FIG. 2B illustrates the battery 108 following the disconnection of the cell 204-3 by the fuse 216-3. The total capacity of the battery 108 is reduced following disconnection of the cell 204-3. In addition, charging of the battery 108 (e.g. in the charger 112) may subject the remaining active cells 204-1 and 204-2 to elevated currents. In particular, the charger 112 may be configured to apply a predetermined current to the battery 108 during charging. If one or more of the cells 104 have been disconnected prior to charging, the current supplied to the battery 108 by the charger 112 is divided among the remaining active cells 204, with each active cell 204 therefore receiving current at a rate that may exceed the charging capacity of the cell 204.

The system 100 therefore includes a battery control device implemented within one or more of the device 104 (e.g. via the execution of an application by a processor, as discussed below), the battery 108, which may include a microcontroller, the charging station 112, and the server 120. The battery control device is configured, as will be discussed below in greater detail, to detect changes in the behavior of the battery 108 that are indicative of one or more of the cells 204 having been disconnected. For example, the internal resistance of the battery 108 decreases in response to disconnection of the cell 204-3. Although direct measurement of the internal resistance may be difficult or unfeasible while the battery 108 is deployed in the device 104 or while the battery 108 is placed in the charger 112, the above-mentioned battery control device is configured to assess battery parameters to determine whether the parameters are indicative of the reduced internal resistance associated with one or more cell disconnections.

Figure 3:
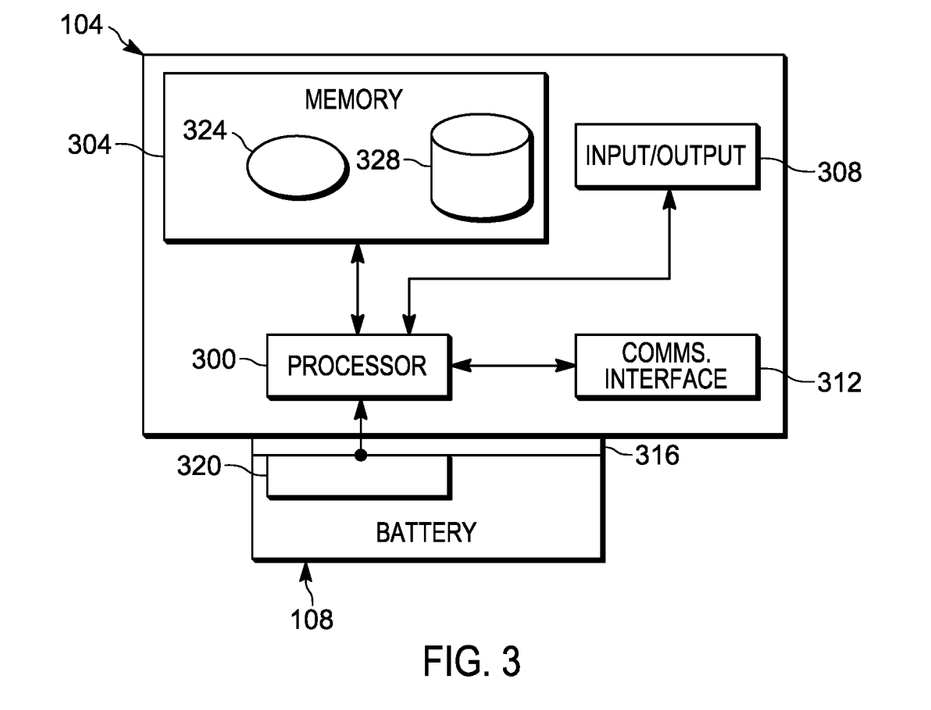
FIG. 3 is a block diagram of certain internal components of the computing device of FIG. 1.

Turning to FIG. 3, certain internal components of the device 104 are illustrated. The device 104 includes a central processing unit (CPU), also referred to as a processor 300, interconnected with a non-transitory computer readable storage medium, such as a memory 304. The memory 304 includes any suitable combination of volatile (e.g. Random Access Memory (RAM)) and non-volatile (e.g. read only memory (ROM), Electrically Erasable Programmable Read Only Memory (EEPROM), flash) memory. The processor 300 and the memory 304 each comprise one or more integrated circuits (ICs).

The device 104 also includes at least one input device, and at least one output device, illustrated in FIG. 3 as an input/output device 308 interconnected with the processor 300. The input device includes any suitable one, or any suitable combination of, a touch screen, a keypad, a trigger (e.g. to initiate the performance of any encoding and/or scanning task), and the like. The output device includes any suitable one, or any suitable combination of a display (e.g., integrated with the above-mentioned touch screen), a speaker, and the like. The input/output device 308 is configured to receive input and provide data representative of the received input to the processor 300, and to receive output from the processor 300 and present the output, e.g. via the emission of sound from the speaker, the rendering of visual indications on the display, and the like.

The device 104 also includes a communications interface 312, enabling the device 104 to exchange data with other computing devices, such as the server 120. The communications interface 312 includes any suitable hardware (e.g. transmitters, receivers, network interface controllers and the like) allowing the device 104 to communicate, e.g. with the server 120, over the network 124.

The components of the device 104 are interconnected by communication buses (not shown), and powered by the above-mentioned communication buses or by distinct power buses (not shown), which transmit electrical power to the components from the battery 108 when the battery 108 is connected to the device 104 via a battery interface 316 (e.g. a set of structures configured to both retain the battery 108 and connect the terminals 208 and 212 of the battery 108 with electrical contacts of the device 104).

The battery 108 itself, as shown in FIG. 3, includes a controller 320 which may also be referred to as a fuel gauge. The controller 320 is configured to maintain, and periodically update, one or more values corresponding to measured operational parameters of the battery 108. For example, the controller 320 in the present embodiment is configured to maintain a periodically updated measured capacity value, also referred to as a state-of-charge (SOC) value. The capacity value is typically represented as a percentage or other fraction (e.g. a value between zero and one) indicating the measured capacity of the battery 108 relative to a preconfigured maximum capacity of the battery 108. The controller 320 can also be configured to maintain measured values corresponding to other battery parameters, such as the voltage between the terminals 208 and 212, the current travelling via the terminals 208 and 212, an ambient temperature, and the like. In other embodiments, the obtaining of measured values corresponding to battery parameters may be performed by the processor 300 via the execution of the application 324, rather than by the controller 320.

The memory 304 of the device 104 stores a plurality of applications, each including a plurality of computer readable instructions executable by the processor 300. The execution of the above-mentioned instructions by the processor 300 causes the device 104 to implement certain functionality, as discussed herein. The applications are therefore said to be configured to perform that functionality in the discussion below. In the present example, the memory 304 of the device 104 stores a battery control application 324, also referred to herein as the application 324. The device 104 is configured, via execution of the application 324 by the processor 300, to obtain some or all of the operational parameter values mentioned above in connection with the battery 108 (e.g. via the interface 316), and to assess the obtained value for an indicator parameter relative to an expected value for the indicator parameter to determine whether one or more of the cells 204 in the battery 108 have been disconnected.

To that end, the memory 304 also stores a repository 328 of values corresponding to battery parameters. The processor 300, via the execution of the application 324, is configured, employing the measured values (e.g. one or more of capacity (SOC), battery age (also referred to as "state of health" or SOH), temperature and current) from the battery 108 as well as data retrieved from the repository 328 (e.g. one or more of internal resistance and open-circuit voltage), to obtain an expected value for the indicator parameter mentioned above (e.g. an expected voltage, or an expected internal resistance). The processor 300 is then configured to determine, by comparing the measured value and the expected value for the indicator parameter, whether a cell 204 has been disconnected. When a determination is made that a cell 204 has been disconnected, the processor 300 is configured to generate an alert, e.g. via the input/output device 308.

The processor 300, as configured by the execution of the application 324, may also be referred to as the above-mentioned battery control device. In other embodiments, the battery control device is instead implemented as one or more specifically-configured hardware elements, such as field-programmable gate arrays (FPGAs) and/or application-specific integrated circuits (ASICs). In further embodiments, the battery control device need not be implemented in the device 104. The battery control device may instead be implemented in the controller 320 of the battery 108, for example. That is, the controller 320 may store the application 324 and the repository 328 in memory and perform the functions implemented by the application 324. As a further example, the charger 112 can include a memory and a processor configured, respectively, to store the application 324 and repository 328, and to execute the application 324. In still further examples, the application 324 and the repository 328 can reside at the server 120, which may be in communication with one or both of the device 104 and the charger 112 to obtain the measured values mentioned above.

Figure 4:
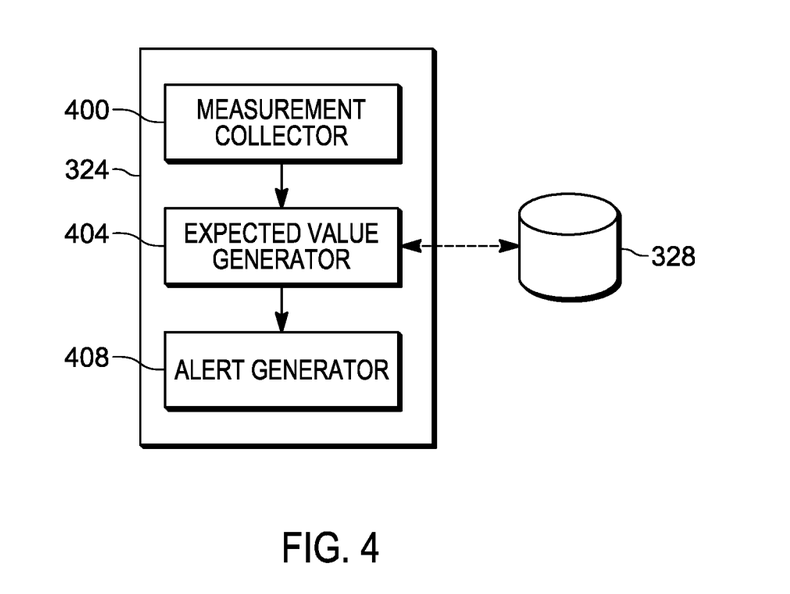
FIG. 4 is a block diagram of certain internal components of the battery control application of FIG. 3.

Referring to FIG. 4, certain components of the application 324 are illustrated. In other embodiments, the components of the application 324 may be implemented as a plurality of distinct applications rather than subcomponents of the application 324. In further embodiments, one or more of the components of the application 324 are implemented as dedicated hardware components, such as the above-mentioned FPGAs and/or ASICs.

The application 324 includes a measurement collector 400 configured to obtain the measured values mentioned above (e.g. by requesting or otherwise receiving the values from the controller 320, by controlling hardware elements of the device 104 itself to obtain the measurements in the absence of the controller 320, and the like). The application 324 also includes an expected value generator 404 configured to generate an expected value for the indicator parameter mentioned above (e.g. an expected voltage value), based on the measurements received from the collector 400 and on the repository 328. The application 324 also includes an alert generator 408, configured to determine whether the expected value obtained by the generator 404 differs from the measured value obtained by the collector 400 by an amount greater than a preconfigured threshold, and to generate an alert based on the outcome of the determination.

Figure 5:
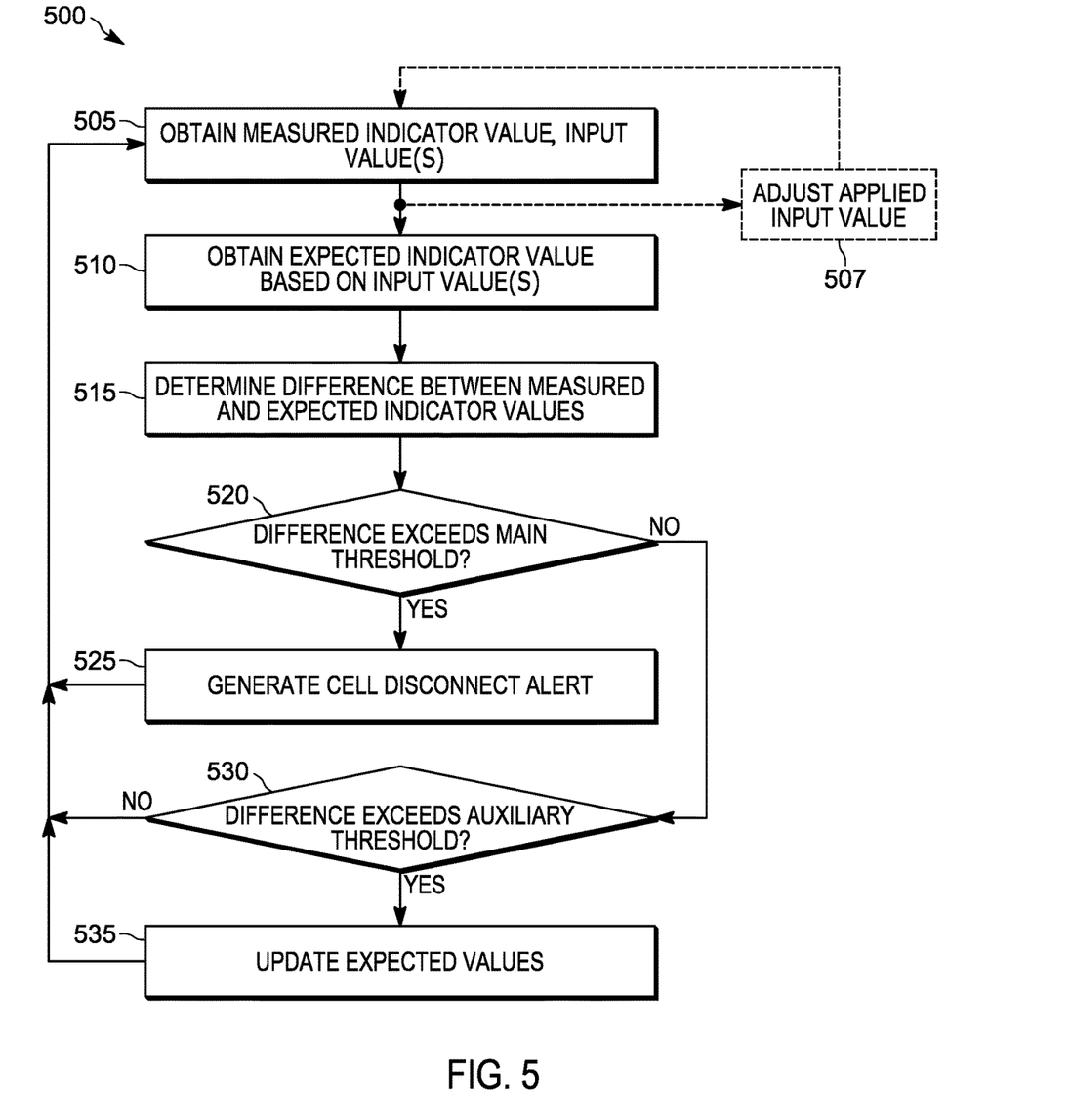
FIG. 5 is a flowchart illustrating a method of assessing multicell battery health.

Referring now to FIG. 5, a method 500 of assessing multicell battery health is illustrated in accordance with the teachings of this disclosure. The method 500 is described below in conjunction with its performance by the processor 300 via the execution of the application 324. In other embodiments, the method 500 can be performed by one or more of the charger 112, the battery 108 (e.g. the controller 320) or the server 120.

At block 505, the collector 400 is configured to obtain a measured indicator value corresponding to an indicator battery parameter, as well as at least one measured input value corresponding to an input battery parameter. The parameters mentioned above are referred to as an "indicator" parameter and "input" parameters because the indicator parameter is employed (via the comparison of measured and expected values) as an indicator of whether one or more cells 204 are likely to have been disconnected from the terminals 208 and 212, while the input parameters are employed as inputs for the retrieval or determination of the expected value of the indicator parameter, as discussed below.

In the present example, the indicator parameter is the voltage across the terminals 208 and 212. Therefore, in the present example performance of the method 500 by the device 104, with the battery 108 coupled thereto via the interface 316 (i.e. with the battery 108 in a discharge mode, supplying power to the device 104), the measured voltage obtained at block 505 is the voltage applied to the device 104 by the battery 108. In other embodiments, for example in which the method 500 is performed by the charger 112 (i.e. with the battery 108 in a charging mode, being supplied power by the charger 112), the measured voltage obtained at block 505 is the voltage across the terminals 208 and 212 resulting from the application of a current to the battery 108 by the charger 112.

The measured indicator value obtained at block 505 may be obtained via measurement within the device 104 (e.g. by the interface 316), or via the charger 112 when the method 500 is performed by the charger 112. The measured indicator value can also be obtained at the processor 300 from the controller 320, for example by transmission of a request from the processor 300 to the controller 320.

The at least one input value obtained at block 505 includes a first input value in the form of a measured capacity value. The measured capacity indicates, for example as a percentage, the energy storage capacity of the battery 108 relative to a predefined maximum capacity. The measured capacity may be obtained, for example, from the controller 320, which as noted earlier is configured to maintain an updated state of charge (i.e. capacity) measurement. In the present example, the input values obtained at block 505 also include a second input value in the form of a measured current at the terminals 208 and 212. In the discharge mode (e.g. when the method is performed by the device 104), the measured current represents the current delivered to the device 104 by the battery 108. In the charging mode (e.g. when the method is performed by the charger 112) the measured current can be set by the charger 112, for example according to a predefined charging profile stored by the charger 112.

The input values obtained at block 505, in the present example, also include a third input value in the form of a measured temperature, for example obtained from a temperature sensor integrated with the controller 320. The temperature sensor may also be integrated with the device 104 and connected to the processor 300 (or integrated with the charger 112, when the method 500 is performed by the charger 112). In general, the measured temperature obtained at block 505 is obtained via a temperature sensor in sufficient physical proximity to the battery 108 to provide an indication of the temperature of the cells 204.

At block 510, the generator 404 is configured to obtain an expected value corresponding to the indicator parameter based on at least one of the input parameters obtained at block 505. In the present example, therefore, at block 510 the generator is configured to obtain an expected voltage across the terminals 208 and 212, based on at least one of the capacity, current, and temperature measurements obtained at block 505.

Specifically, at block 510 in the present embodiment, the generator 404 is configured to obtain the expected indicator value (e.g. the expected voltage) by retrieving at least one expected value corresponding to an intermediate parameter from the repository 328. The repository 328 contains a plurality of preconfigured intermediate parameter values. The intermediate values are typically measured from one or more battery samples, e.g. during manufacturing, and provided to the device 104 for storage in the repository 328.

That is, the intermediate values represent the expected performance of the battery 108 under various conditions (the conditions being defined by one or more of the input parameters mentioned above).

Figure 6A:
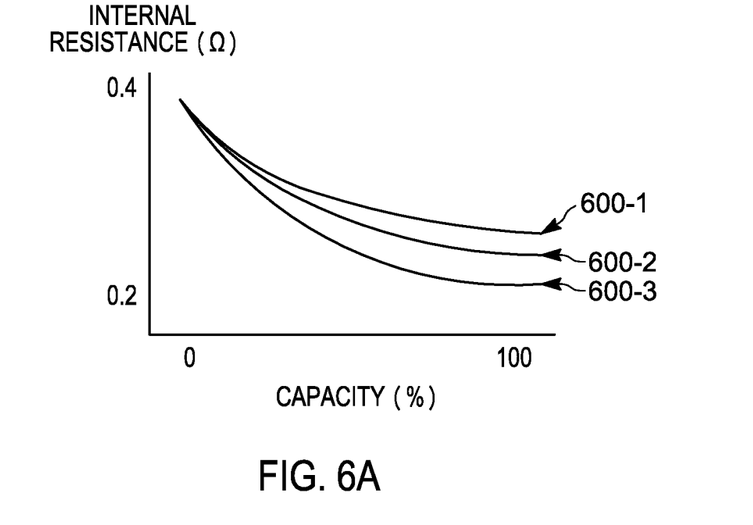
FIGS. 6A and 6B illustrate expected values for battery parameters employed in the method of FIG. 5.
Figure 6B:
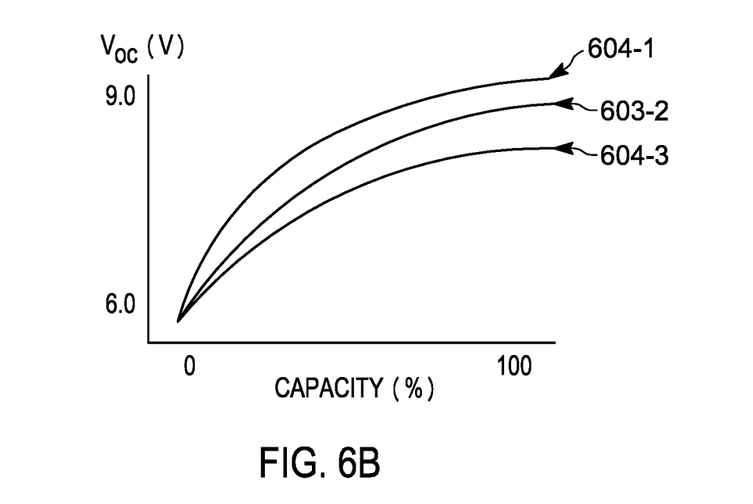

The intermediate values correspond to parameters from which the expected indicator parameter can be derived. In the present example, the intermediate parameters include open-circuit voltage $V_{OC}$. The open-circuit voltage is the voltage across the terminals 208 and 212 in the absence of a load connected to the battery 108, in contrast to the voltage measured at block 505, which is the voltage across the terminals 208 and 212 in the presence of a load, such as the device 104. In the present example, the intermediate parameters also include internal resistance of the battery 108. The open-circuit voltage of the battery 108, and the internal resistance of the battery 108, both vary according to temperature and capacity (i.e. state of charge). Therefore, the repository 328 contains a plurality of expected values for open-circuit voltage and internal resistance for a plurality of capacity and temperature values. FIGS. 6A and 6B depict example data sets that may be contained in the repository 328.

In particular, FIG. 6A depicts a plurality of expected internal resistance values, each expected internal resistance value corresponding to a given measured capacity and measured temperature. Specifically, three series 600-1, 600-2 and 600-3 of expected internal resistance values in relation to measured capacities are shown, with each series corresponding to a respective measured temperature. For example, the series 600-1 may correspond to a first temperature, the series 600-2 may correspond to a second temperature lower than the first temperature, and the series 600-3 may correspond to a third temperature lower than the second temperature. FIG. 6B, meanwhile, illustrates three series 604-1, 604-2, 604-3 corresponding to respective temperatures. Each series defines, for the corresponding temperature, a plurality of expected open-circuit voltages at various measured capacities.

The data in the repository 328, in other words, defines the expected performance of the battery 108 under various conditions when the battery 108 is in a "healthy" state, and particularly when all of the cells 204 are active. The repository need not store the expected intermediate values in a graph format as shown in FIGS. 6A and 6B. For example, in some embodiments the repository 328 can contain one or more tables defining the expected intermediate values. Table 1, below, is an example storage format for expected internal resistance values and expected open-circuit voltage values according to capacity and temperature (i.e. an alternative format to the format shown in FIG. 6A). In other examples, the expected internal resistance values can be stored in a separate table from the expected open-circuit voltage values.

TABLE 1

Expected Internal Resistance and Open-Circuit Voltage

| Capacity | Temp. | | | | | |
|---|---|---|---|---|---|---|
| | −20 | −10 | 0 | ... | 50 | 60 |
| 10 | $R_{a1}, OCV_{a1}$ | $R_{b1}, OCV_{b1}$ | $R_{c1}, OCV_{c1}$ | ... | $R_{h1}, OCV_{h1}$ | $R_{i1}, OCV_{i1}$ |
| 20 | $R_{a2}, OCV_{a2}$ | $R_{b2}, OCV_{b2}$ | $R_{c2}, OCV_{c2}$ | ... | $R_{h2}, OCV_{h2}$ | $R_{i2}, OCV_{i2}$ |
| ... | ... | ... | ... | ... | ... | ... |
| 90 | $R_{a9}, OCV_{a9}$ | $R_{b9}, OCV_{b9}$ | $R_{c9}, OCV_{c9}$ | ... | $R_{h9}, OCV_{h9}$ | $R_{i9}, OCV_{i9}$ |
| 100 | $R_{a0}, OCV_{a0}$ | $R_{b0}, OCV_{b0}$ | $R_{c0}, OCV_{c0}$ | ... | $R_{h0}, OCV_{h0}$ | $R_{i0}, OCV_{i0}$ |

As will be apparent from Table 1, the repository 328 can contain series of expected resistances for the battery 108 for a greater number of temperatures than the three temperatures represented in FIG. 6A. The resolution and range of both the capacity and temperature input parameters need not be as shown above or in FIG. 6A. The expected open-circuit voltage values may also be stored in a tabular format as shown above in other embodiments. In further embodiments, the series shown in FIGS. 6A and 6B, as well as the data shown in Table 1 above, can define expected internal resistances and expected open-circuit voltages for not only temperature and capacity inputs, but also for a state of health (SOH) input. In other words, the repository 328 can define a three-dimensional look-up table, in which inputs in the form of temperature, SOC and SOH are employed to retrieve expected internal resistances and expected open-circuit voltages. In further embodiments, the expected internal resistance and the expected open-circuit voltage may require different inputs to retrieve. For example, a three-dimensional lookup (e.g., based on SOC, SOH and temperature) may be performed to retrieve an expected internal resistance, while a two-dimensional lookup (e.g., based on SOC and temperature) may be performed to retrieve an expected open-circuit voltage.

Returning to FIG. 5, to conclude the performance of block 510 the generator 404 is configured to generate an expected indicator value (e.g., an expected voltage) based on the intermediate parameter values and the measured input parameter values mentioned above. For example, in the present embodiment, the generator 404 is configured to retrieve an expected internal resistance based on the measured temperature and capacity values (and, optionally, a measured SOH value obtained from the controller 320). The expected internal resistance, together with the measured current, are then employed by the generator 404 to generate an expected voltage across the terminals 208 and 212 for comparison with the measured voltage obtained at block 505. While the generation of an expected voltage can be based on single measured values, in some embodiments a plurality of measured values are collected, and prior to the determination at block 515, discussed below, measured and expected delta values are generated for the indicator parameter. The use of deltas rather than single values may reduce the impact of variations in the measured parameters, for example responsive to changes in the load applied to the battery 108.

Table 2, below, illustrates an example set of measured values obtained at block 505, for a performance of the method 500 in which the indicator parameter is voltage, and the input parameters are SOC, SOH, temperature and current.

TABLE 2

Measured Indicator and Input Values

| Measured Indicator Value (V) | Measured Input Values | | | |
|---|---|---|---|---|
| | Measured SOC (%) | Measured SOH (%) | Measured Current (A) | Measured Temperature (° C.) |
| 4.120 | 100 | 100 | 0.582 | 25 |
| 4.148 | 100 | 100 | 0.289 | 25 |
| 4.114 | 100 | 100 | 0.583 | 25 |
| . . . | . . . | . . . | . . . | . . . |
| 4.162 | 98 | 100 | 0.119 | 25 |
| 4.164 | 98 | 100 | 0.120 | 25 |

As seen in Table 2 (in which some rows are omitted for simplicity), at block 505 a plurality of measured indicator values and a plurality of measured input values are obtained over a period of time. Following the collection of the above measurements, at block 510 the generator 404 is configured to generate an expected voltage value by generating measured delta values for the indicator parameter and for the current measurements. For example, the generator 404 can be configured to select the minimum and maximum voltages and currents. From the data in Table 2, it can be seen that the minimum and maximum voltages, respectively, are 4.114 and 4.164. The measured voltage delta is therefore 0.05V. The minimum and maximum current values, meanwhile are 0.119 and 0.583, and the measure current delta is therefore 0.464.

The generator 404 is also configured to retrieve an intermediate value, in the form of an internal resistance, based on the input SOC, SOH and temperature values. Specifically, in the present example the generator 404 is configured to determine an average value for each of the above-mentioned inputs (e.g., 99.3% for SOC, 100% for SOH and 25° C. for temperature). The generator 404 is then configured to retrieve an expected internal resistance (e.g. 0.12Ω) corresponding to the average input values from the repository 328.

Having generated the measured current delta and retrieved the expected internal resistance, the generator 404 is configured to generate an expected voltage delta by applying Ohm's law to the measured current delta and the retrieved expected internal resistance. The resulting expected voltage delta, using the example data of Table 2, is 0.05568.

In other examples, the indicator parameter is internal resistance rather than voltage. In such examples, the measured indicator value is not measured directly at block 505, but is instead generated based on the measurements obtained at block 505. Employing the same set of input data as shown in Table 2, the collector 400 can be configured to obtain the measured voltage, SOC, SOH, current and temperature values. The collector 400 can then be configured to generate a "measured" (although not directly measured) internal resistance by retrieving an expected open-circuit voltage from the repository 328 based on the average SOC noted earlier (and optionally, also based on the average temperature). For example, the expected open-circuit voltage may be 4.18 V.

A measured indicator value, in the form of a measured internal resistance value, can then be generated by applying Ohm's law to a measured current and a difference between a measured voltage and the retrieved open-circuit voltage. In the present example, an average internal resistance is generated from two internal resistances. The first internal resistance is calculated using the retrieved open-circuit voltage, the maximum measured voltage and the minimum measured current. The second internal resistance is calculated using the retrieved open-circuit voltage, the minimum measured voltage and the maximum measured current. In an example based on the data in Table 2, the measured internal resistance is 0.1238Ω.

Following generation of the measured internal resistance as above, the generator 404 is configured to retrieve an expected internal resistance via a lookup in the repository 328, using the average SOC, SOH and temperature values as inputs. For example, the expected internal resistance as stored in the repository may be 0.12Ω.

At block 515 the generator 404 is configured to determine a difference between the measured indicator value (e.g., the measured voltage in the present example) and the expected indicator value generated at block 510. For example, the generator 404 can be configured to subtract one of the measured and expected indicator values from the other of the measured and expected indicator values. Taking the first example above, in which the measured indicator value is a voltage delta, the generator 404 is configured to compare the measured voltage delta (0.05 V) to the expected voltage delta (0.05568 V) at block 515. The difference determined at block 515 may be an absolute number (e.g. 0.0068 V), or a percentage of the measured voltage delta (e.g. 11.4%). Taking the second example above, in which the measured indicator value is an internal resistance, the generator 404 is configured to compare the measured internal resistance (0.1238Ω) to the expected internal resistance (0.12Ω) at block 515. The difference may be generated as an absolute number (e.g., 0.0038Ω) or as a percentage (e.g., 3%).

At block 520, the alert generator 408 is configured to determine whether the difference determined at block 515 exceeds a main threshold. The main threshold is predefined, for example in the repository 328. As will be apparent to those skilled in the art, when one or more of the cells 204 are disconnected within the battery 108, the internal resistance of the battery 108 deviates substantially from the expected internal resistance as represented in the repository 328. As a result, an expected voltage generated at block 510, which is based on the expected internal resistance and not on the altered actual internal resistance resulting from the disconnection of a cell 204, deviates from the measured voltage. Similarly, when internal resistance is the indicator parameter, the measured internal resistance deviates from the expected internal resistance when a cell has been disconnected. The main threshold defines a magnitude of the above-mentioned deviation that indicates that a cell 204 has been disconnected. The main threshold may, for example, be determined in a testing operation (e.g. along with the expected values for internal resistance and open-circuit voltage) and loaded into the repository 328. The main threshold can be expressed as a percentage or as an absolute number, according to the form of the difference determined at block 515. For example, a main threshold of 10% may be employed. It will be understood that a wide variety of other main thresholds may also be implemented.

When the determination at block 520 is affirmative—that is, when the difference between the measured and expected values for the indicator parameter exceeds the main threshold—the alert generator 408 is configured to proceed to block 525. In relation to the example indicator voltage generation described above, the determination at block 520 is affirmative, as the difference determined at block 515 (11.4%) is greater than the example main threshold of 10%. At block 525, the alert generator 525 is configured to generate an alert indicating that one or more cells 204 of the battery 108 have been disconnected. A wide variety of alerts may be generated at block 525. For example, the alert generator 408 may control the input/output device 308 to present a warning message on a display, emit a tone or other sound file via a speaker, activate an indicator light (e.g. an alert LED), or a combination of the above. In other examples, in which the charger 112 performs the method 500, the charger 112 may include an output device such as a speaker, display, LED indicator or the like (or a combination thereof) which may be controlled as described above.

In further embodiments, the alert generator 404 can be configured to transmit an alert message via the communications interface 312, for example to the server 120, indicating that the battery 108 is defective. In still further embodiments, in which the battery 108 itself (e.g. the controller 320) performs the method 500, the battery 108 may include an indicator light, speaker or other output device for generating the alert. The battery 108 may also be configured to transmit an alert message, for example to the device 104 via the interface 316 or to the charger 112 via a corresponding interface.

When the determination at block 520 is negative, in some embodiments the method 500 ends. In other embodiments, as illustrated in FIG. 5, performance of the method 500 proceeds to block 530. At block 530, the application 324 is configured to determine whether the difference determined at block 515 exceeds an auxiliary threshold that is smaller than the main threshold. The auxiliary threshold may be stored in the repository 328, and is selected to detect aging of the battery 108. Specifically, as the battery 108 ages, certain parameters, such as maximum capacity and internal resistance, change (e.g., internal resistance may increase), resulting in behavior of the battery that does not align with the expected values stored in the repository despite no cell loss having occurred.

When the determination at block 530 is negative, the performance of the method 500 can end, or can return to block 505. When the determination at block 530 is affirmative, however, the application 324 is configured to proceed to block 535 and update at least a portion of the expected values stored in the repository 328. The updates applied at block 535 reflects the aging of the battery 108. For example, the expected internal resistance values and the expected open-circuit voltage values may be adjusted by a percentage selected based on the difference determined at block 515. In another example, the expected internal resistance values and the expected open-circuit voltage values may be adjusted by a predetermined step amount (e.g. specified in the repository 328) for each instance of an affirmative determination at block 530.

In other embodiments, rather than the auxiliary threshold, the application 324 can be configured to retrieve a state of health (SOH) indicator (e.g. from the battery controller 328) and to automatically adjust the intermediate parameter values mentioned above according to the state of health indicator. For example, if the SOH indicator indicates that the battery 108 has eighty percent of an expected operational lifetime remaining, the intermediate parameter values retrieved at block 510 may be adjusted by twenty percent before the expected indicator value is generated.

Variations to the above methods are contemplated. For example, as shown in FIG. 5, following the performance of block 505, but before the performance of block 510, the application 324 can be configured to perform block 507. At block 507, the application 324 is configured to adjust an applied input value. As noted earlier, the method 500 may be performed by the charger 112, and certain input parameter values such as current may be selected by the charger 112 and applied to the battery 108 rather than measured. In such embodiments, the charger 112 can be configured to collect two or more sets of indicator values and input values (e.g. capacity) by applying two or more selected input values (e.g. current). Thus, the charger 112 can be configured to apply a first charging current to the battery 108 and to collect corresponding voltage, capacity and temperature values, and to then (at block 507) adjust the applied current and return to block 505 to collect another set of voltage, capacity and temperature measurements before proceeding to block 510.

The collection of multiple sets of values at block 505, following adjustment of an input parameter such as current at block 507, may enable the charger 112 to more accurately generate the expected indicator value at block 510. In the example calculations of expected voltage and internal resistance set out above, deltas are employed rather than single values. The modulation of an input parameter such as current enables the charger 112 to collect measurements at block 505 that exhibit greater deltas, which may reduce the effect of measurement noise on the resulting expected indicator values.

In further embodiments, the expected indicator value obtained at block 510 may be obtained by the application 324 by requesting the expected indicator value from another device, such as the server 120. More generally, the battery control device performing the method 500 (which may be the application 324, the controller 320 or the charger 112) can obtain the expected indicator value at block 510 by sending the measured values from block 505 to another computing device and in return, receiving the expected indicator value from that other computing device.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A method of assessing multicell battery health in a battery control device, comprising:
   obtaining (i) a measured indicator value, and (ii) a measured first input value;
   obtaining, based on the measured first input value, an expected indicator value;
   determining whether a difference between the measured indicator value and the obtained expected indicator value exceeds a predefined cell loss threshold; and
   when the difference exceeds the predefined cell loss threshold, generating a cell loss alert.

2. The method of claim 1, wherein the measured indicator value is a measured voltage supplied by the battery.

3. The method of claim 2, wherein the measured first input value is a measured battery capacity.

4. The method of claim 3, further comprising:
   obtaining a measured second input value; and
   obtaining a measured third input value corresponding to a third input parameter;
   wherein obtaining the expected indicator value is based on the measured first input value, the measured second input value and the measured third input value.

5. The method of claim 4, wherein the measured second input value is a measured temperature; and wherein the measured third input value is a measured current.

6. The method of claim 3, further comprising:
   retrieving, based on the measured second input value and the measured third input value, an expected intermediate input value; and
   generating the expected indicator value based on the expected intermediate input value and at least one of the measured first, second and third input values.

7. The method of claim 6, wherein the expected intermediate value includes an expected internal resistance value.

8. The method of claim 5, further comprising controlling a charging assembly to apply the measured current to the battery.

9. The method of claim 8, further comprising:
   prior to obtaining the expected indicator value, controlling the charging assembly to apply a further measured current to the battery;
   obtaining a further measured indicator value and further measured first, second and third input values; and
   obtaining the expected indicator value based on the measured first, second and third input values and the further measured first, second and third input values.

10. The method of claim 1, further comprising: presenting the cell loss alert via an output device.

11. A battery control device for assessing multicell battery health, comprising:
    a collector configured to obtain (i) a measured indicator value, and (ii) a measured first input value;
    an expected value generator configured to obtain, based on the measured first input value, an expected indicator value; and
    an alert generator configured to:
        determine whether a difference between the measured indicator value and the obtained expected indicator value exceeds a predefined cell loss threshold; and
        when the difference exceeds the predefined cell loss threshold, generate a cell loss alert.

12. The battery control device of claim 11, wherein the measured indicator value is a measured voltage supplied by the battery.

13. The battery control device of claim 12, wherein the measured first input value is a measured battery capacity.

14. The battery control device of claim 13, the collector further configured to:
 obtain a measured second input value; and
 obtain a measured third input value;
 wherein obtaining the expected indicator value is based on the measured first input value, the measured second input value and the measured third input value.

15. The battery control device of claim 14, wherein the measured second input value is a measured temperature; and wherein the measured third input value is a measured current.

16. The battery control device of claim 13, the expected value generator further configured to:
 retrieve, based on the measured second input value and the measured third input value, an expected intermediate input value; and
 generate the expected indicator value based on the expected intermediate input value and at least one of the measured first, second and third input values.

17. The battery control device of claim 16, wherein the expected intermediate value includes an expected internal resistance value.

18. The battery control device of claim 15, the collector further configured to control a charging assembly to apply the measured current to the battery.

19. The battery control device of claim 18, the collector further configured to:
 prior to obtaining the expected indicator value, control the charging assembly to apply a further measured current to the battery;
 obtain a further measured indicator value and further measured first, second and third input values;
 the expected value generator configured to obtain the expected indicator value based on the measured first, second and third input values and the further measured first, second and third input values.

20. The battery control device of claim 11, the alert generator further configured to present the cell loss alert via an output device.

* * * * *